United States Patent
Andreev et al.

(10) Patent No.: US 6,842,750 B2
(45) Date of Patent: Jan. 11, 2005

(54) SYMBOLIC SIMULATION DRIVEN NETLIST SIMPLIFICATION

(75) Inventors: Alexander E. Andreev, San Jose, CA (US); Ranko Scepanovic, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 486 days.

(21) Appl. No.: 10/108,286

(22) Filed: Mar. 27, 2002

(65) Prior Publication Data

US 2003/0187815 A1 Oct. 2, 2003

(51) Int. Cl.[7] ............................................. G06F 17/30
(52) U.S. Cl. ...................... 707/3; 707/1; 707/5; 707/6; 707/102; 716/2; 716/7
(58) Field of Search .......................... 707/1–6, 10, 102; 706/45, 52; 716/2, 3, 7, 18

(56) References Cited

U.S. PATENT DOCUMENTS

| | | | | |
|---|---|---|---|---|
| 5,434,794 A | * | 7/1995 | Coudert et al. ................. | 716/2 |
| 5,548,524 A | * | 8/1996 | Hernandez et al. ........... | 716/12 |
| 5,933,356 A | * | 8/1999 | Rostoker et al. ............... | 703/15 |
| 6,047,283 A | * | 4/2000 | Braun ............................ | 707/3 |
| 6,243,720 B1 | * | 6/2001 | Munter et al. ............... | 707/206 |
| 6,247,165 B1 | * | 6/2001 | Wohl et al. .................... | 716/5 |
| 6,397,370 B1 | * | 5/2002 | Fernandez et al. ............. | 716/2 |
| 6,421,660 B1 | * | 7/2002 | Glaise ........................... | 707/3 |

* cited by examiner

Primary Examiner—Charles Rones
Assistant Examiner—Jacques Veillard
(74) Attorney, Agent, or Firm—Suiter West

(57) ABSTRACT

The present invention is directed to a simplification method for an arbitrary library. In aspects of the present invention, the method does not rely on specific properties of the library elements and has linear complexity. The present invention may be implemented based on a symbolic simulation in an alphabet which contains 0, 1, symbols of variables, and negations of the variables' symbols. In an aspect of the present invention, a method for reducing redundancy in a simulation through use of a symbolic simulation utilizing an arbitrary library includes receiving a set A of values, the set A including input variables which are elements of the set A. Symbols of the input variables are constructed in which like and similar variables share a like symbol and a similar symbol respectively. A table of output values computed from a table of a Boolean operator employing the constructed symbols of the input variable is formed, the constructed symbols formed to reduce redundancy.

23 Claims, 3 Drawing Sheets

SYMBOLIC SIMULATION DRIVEN NETLIST SIMPLIFICATION

CROSS REFERENCE TO RELATED APPLICATIONS

The present application incorporates by reference in their entirety U.S. Pat. No. 6,553,370, titled "Flexible Search Engine Having Sorted Binary Search Tree for Perfect Match" filed Oct. 4, 2000; and U.S. Pat. No. 6,564,211, titled "Fast Flexible Search Engine for Longest Prefix Match", filed Oct. 4, 2000.

FIELD OF THE INVENTION

The present invention generally relates to the field netlists, and particularly to a symbolic simulation driven netlist simplification.

BACKGROUND OF THE INVENTION

As the desire for increased and wide-ranging integrated circuit functionality continue to expand, manufacturers and designers of integrated circuits (IC) are confronted with the associated increase in complexity. Therefore, when designing and testing an integrated circuit, tasks which were relatively efficient when circuit designs contained fewer elements have increased in complexity where a task thought relatively simple before may now take weeks to perform.

For example, in designing an integrated circuit (IC), a netlist may be employed to describe names of components and connection points which are logically connected in each net of a circuit. Additionally, it may be useful to employ a descriptor language, such as a register transfer language (RTL), to be used in describing registers in an information handling system, such as a desktop computer, server, digital information appliance, convergence device, and the like, and how data is transferred between the registers.

However, a netlist, after complication from an RTL level to a generic library, may contain redundant elements. For example, a netlist may contain constants, equivalent nets, inverted pairs of nets, and the like redundant fragments. Further, many compilers may not contain optimizations which may be utilized to simplify the structure. However, standard and nonstandard elements may be encountered, so that optimization may be difficult utilizing a predefined library.

Therefore, it would be desirable to provide a simplification system and method for an arbitrary library.

SUMMARY OF THE INVENTION

Accordingly, the present invention is directed to a simplification method for an arbitrary library. In aspects of the present invention, the method does not rely on specific properties of the library elements and has linear complexity. The present invention may be implemented based on a symbolic simulation in an alphabet which contains 0, 1, symbols of variables, and negations of the variables' symbols.

In an aspect of the present invention, a method for reducing redundancy in a simulation through use of a symbolic simulation utilizing an arbitrary library includes receiving a set A of values, the set A including input variables which are elements of the set A. Symbols of the input variables are constructed in which like and similar variables share a like symbol and a similar symbol respectively. A table of output values computed from a table of a Boolean operator employing the constructed symbols of the input variable is formed. Output symbols from the table of output values are created according to the following method. If all bits of a table index i of the table of output values $(Ty\_i)$ is constant, the symbol $b\_i$ for the index is set equal to the constant. If the table output index i of the table of output values $(Ty\_i)$ is equal to a Boolean variable $(X\_j)$, the symbol $b\_i$ is set equal to the input variable symbol constructed from the value of input variable. If the table output index i of the table of output values $(Ty\_i)$ is approximately equal to a Boolean variable $(X\_j)$, the symbol $b\_i$ is set approximately equal to the input variable symbol constructed from the value of input variable. Otherwise, the symbol $b\_i$ is set as undefined.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
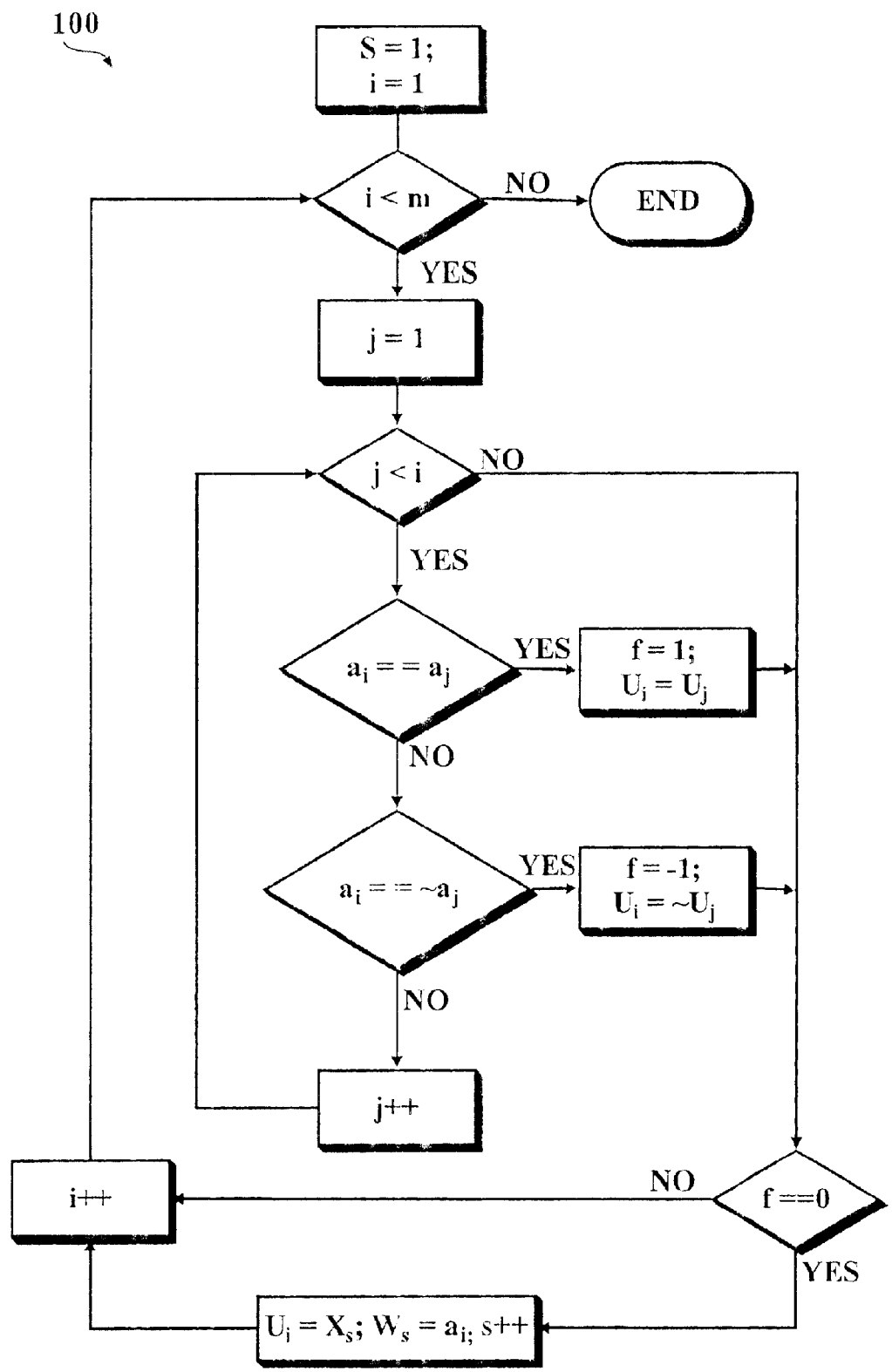
FIG. 1 is a flow diagram illustrating an exemplary embodiment of the present invention wherein symbols for values of input variables and symbols for inputs to variable operator are generated.
Figure 2:
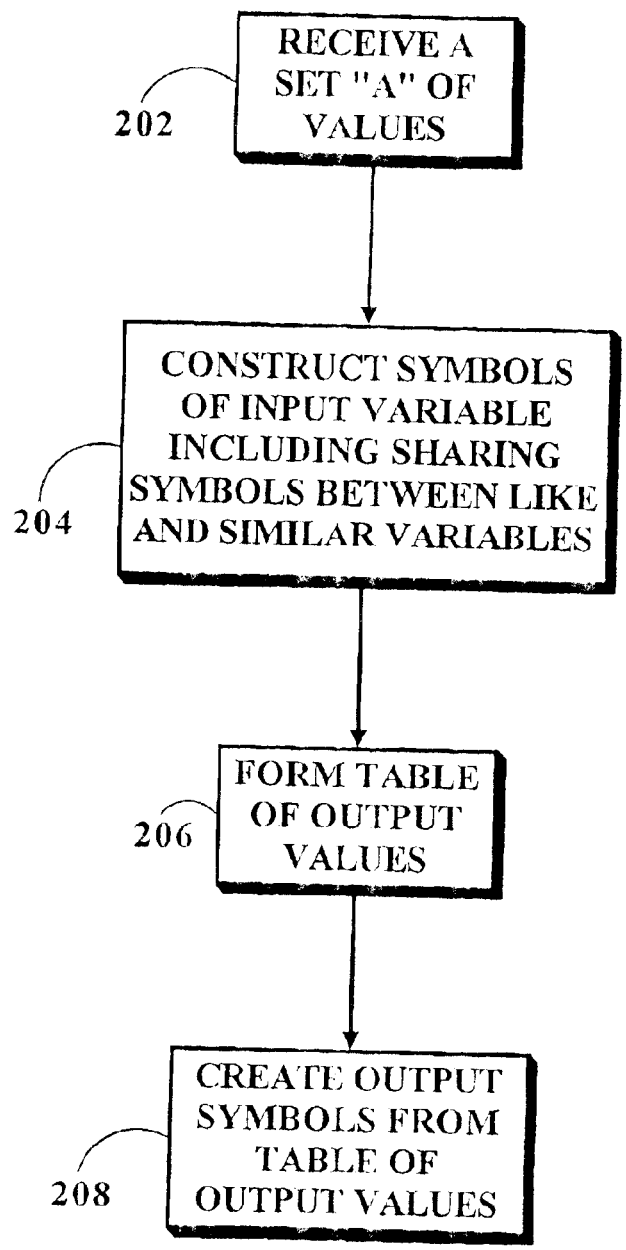
FIG. 2 is a flow diagram depicting an exemplary method of the present invention wherein a symbolic simulation is provided for improved simulation of a netlist.
Figure 3:
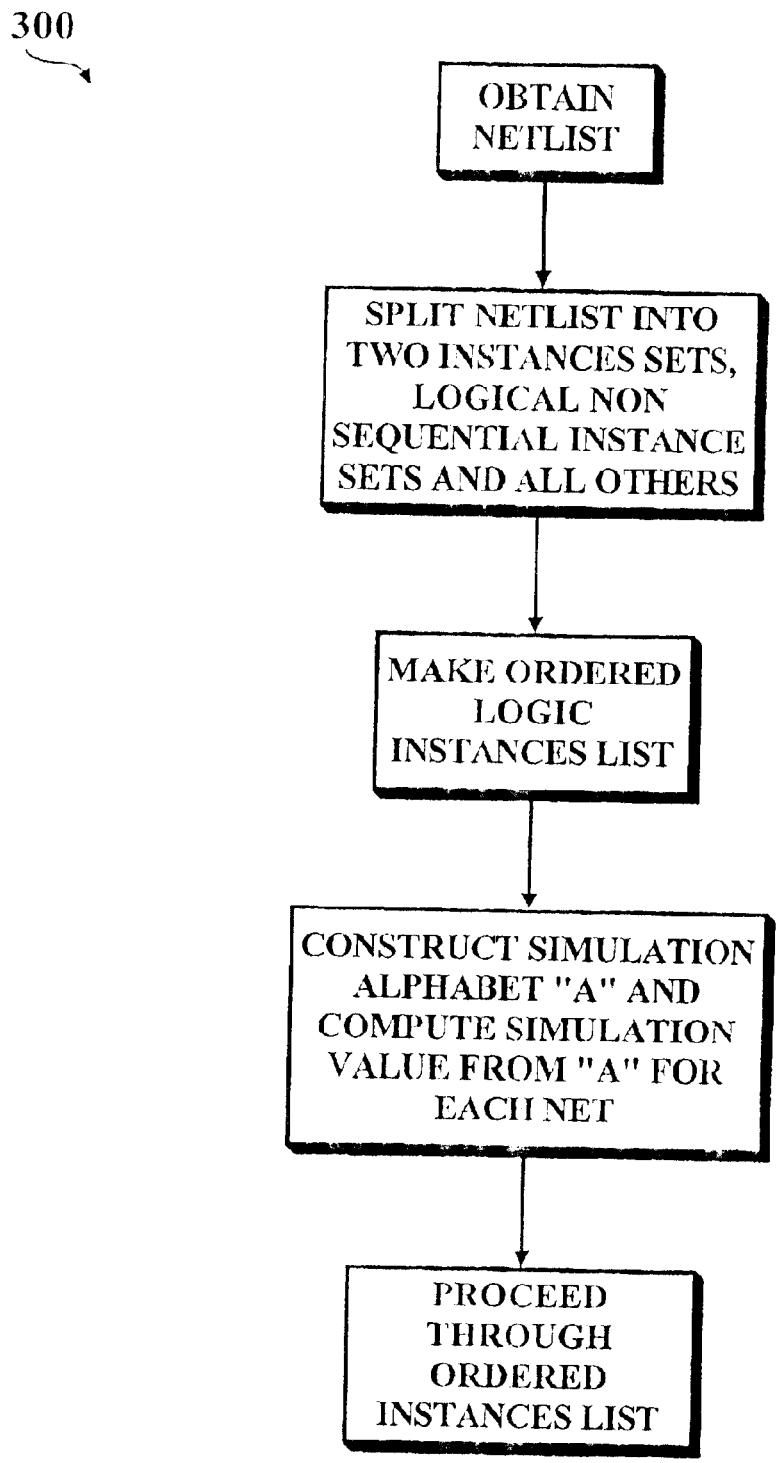
FIG. 3 is a flow diagram illustrating an exemplary method of the present invention wherein a global symbolic simulation provided for improved simulation of a netlist is shown.

Referring generally now to FIGS. 1 through 3, exemplary embodiments of the present invention are shown. The present invention provides a fast simplification procedure of a netlist given in an arbitrary library in order to decrease the area and increase the performance. The present invention has a variety of uses, such as in FFS High Speed Lookup Engines for a perfect and longest prefix matches [1,2], is applicable for any design netlist given in a generic or a technology library, and the like as contemplated by a person of ordinary skill in the art.

Generally, netlists are redundant after compilation from RTL level to the generic library. For instance, netlists may contain constants, equivalent nets, inverted pairs of nets and other redundant fragments. In the case of a compilation FFS search engine from C++ to generic netlist, a large redundancy may be encountered, mainly because a compiler may not contain some optimizations. For example, the generic library of a FFS compiler may contain standard elements and other more complex elements, such as pieces of comparators, adders and other data-path operators. By utilizing the present invention, simplification methods are provided which are fast and effective in the case of an arbitrary library.

Simplification methods are provided by the present invention which may be employed for an arbitrary library. The methods need not use specific properties of the library elements, and in aspects of the present invention, the methods have linear complexity. The method may be based on the symbolic simulation in the alphabet which contains 0, 1, the symbols of variables, the negations of variables symbols.

Local Simulation

For example, let A be the set $\{0, 1, v\_1, v\_2, \ldots, v\_N, \sim v\_1, \sim v\_2, \ldots, \sim v\_N\}$. Additionally, let $F(y\_1, \ldots, y\_k, x\_1, \ldots, x\_m)$ be a Boolean operator with inputs $x\_1, \ldots, x\_m$ and outputs $y\_1, \ldots, y\_k$. Further, let $a\_1, \ldots, a\_m$ be values of input variables, which are elements of the set A.

Described in this section is a method of computation of symbolic values on outputs of the operator F. Let n be the number of different indexes i from $\{1, \ldots, N\}$, that $v\_i$ or $\sim v\_i$ is in the list $a\_1, \ldots, a\_m$. Additionally, $X\_1, \ldots, X\_n$ are Boolean variables. Symbols $U\_1, \ldots, U\_m$ and $W\_1, \ldots, W\_n$ are constructed by the method 100 depicted in FIG. 1. Suppose $\sim\sim v\_i = v\_i$ and $\sim\sim X\_i = X\_i$. In FIG. 1, symbols are constructed from like and similar value of input variables to reduce redundancy.

Consider Boolean operator $G(y\_1, \ldots, y\_k, X\_1, \ldots, X\_n) = F(y\_1, \ldots, y\_k, U\_1, \ldots, U\_m)$. By using the table of the operator F, G is computed for all possible values of $X\_1, \ldots, X\_n$. Let $Ty\_1, \ldots, Ty\_k$ be the tables of size $2^{\{n\}}$ of values of outputs $y\_1, \ldots, y\_k$. Further, let $TX\_1, \ldots, TX\_n$ are the tables of size $2^{\{n\}}$ of the selector functions $X\_1, \ldots, X\_n$.

The output symbols $b\_1, \ldots, b\_k$ are computed by below rules:

if all bits of $Ty\_i$ are 0, then $b\_i=0$;

if all bits of $Ty\_i$ are 1, then $b\_i=1$:

if $Ty\_i == X\_j$, then $b\_i = W\_j$;

if $Ty\_i == \sim X\_j$, then $b\_i = \sim W\_j$;

otherwise $b\_i = *$, i.e. undefined.

It should be noted that each $b\_i$ is a symbol from A or *. In this way, symbols are created for an arbitrary library in an efficient manner to reduce redundancy by utilizing symbols for same and similar values; and determining and storing constants to further reduce processing.

For instance, referring to the exemplary method 200 shown in FIG. 2, a method for performing a local symbolic simulation in an efficient manner is shown. A set "A" of values is received 202, such as by an information handling system operable to employ the present invention, and the like. Symbols are constructed of input variables, in which, symbols are shared between like and similar variables 204. A table of output values is then computed from a table of a Boolean operator 206. Output symbols are then created from the table of output values 208. Creating output symbols may include determining constants, combining like and similar output values into like and similar symbols, combining positive and negative like variables that are denoted as such, and the like as contemplated by a person of ordinary skill in the art without departing from the spirit and scope thereof.

Global Simulation

The following is an example of a global simulation. A netlist is split into two instances sets: logical non sequential and all others. The ordered logic instances list may be constructed by a variety of algorithms. For each instance in the list a driver of any input net may be the following:

input port of netlist, output of non logical cell, output of logical cell with smaller index in the ordered list.

A simulation alphabet A may be constructed from the names of all netlist nets. A simulation value $S(NT)$ is computed from A for each net NT. On the first step:

if $NT\_i$ is constant 0 then $S\_i=0$;

if $NT\_i$ is constant 1 then $S\_i=1$;

if $NT\_i$ is input port of netlist or output of non logical cell then $S\_i=NT\_i$.

On the next step, the ordered instances lists are processed. Let i-th instance is $f(.y\_1(NO\_1), \ldots, .y\_k(NO\_k), .x\_1(NI\_1), \ldots, .x\_m(NI\_m))$; where $x\_1, \ldots, x\_m$ are inputs and $y\_1, \ldots, y\_k$ are outputs.

The simulation values $S(NI\_1), \ldots, S(NI\_m)$ are already known. Values $S(NO\_1), \ldots, S(NO\_k)$ are computed in accordance with the above section algorithm. If $S(NO\_i) == *$ is obtained, then $S(NO\_i)$ is set equal to $NO\_i$.

Next, set of variables V are constructed by progressing through the ordered instances list. On the first step, this may include the input ports of the netlist and the outputs of the non logical cells. Considering the i-th logic instance, which may be represented as follows:

$$F(.y\_1(NO\_1), \ldots, .y\_k(NO\_k), .x\_1(NI\_1), \ldots, .x\_m(NI\_m)).$$

If the value $S(NO\_i)$ is not variable or variable from set V, the value may be denoted as undefined, i.e. *, otherwise the variable $S(NO\_i)$ is added to the set V.

To further simplify, the netlist nets marked by * are removed. Additionally, and remove all instances which do not have directed connection to the outputs of logical subnetlist may be removed, such as output ports of netlist, inputs of non logical elements, and the like. An exemplary method 300 suitable for providing such global simulation is shown in FIG. 3.

Local Simplification

After above procedure, further optimizations may be performed. For example, output pins of a cell are marked by * may be deleted, input pins of a cell are marked by constant may be noted, input pins of a cell are marked by negations of variables may be combined; pins having similar or inverse outputs may be combined, and the like as contemplated by a person of ordinary skill in the art. These situations may be solved inside library rules, for instance, if simpler elements with corresponding functionality are available.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A computer executable method for reducing redundancy in a simulation through use of a symbolic simulation utilizing an arbitrary library, comprising:

receiving a set A of values, the set A including input variables which are elements of the set A;

constructing symbols of the input variables in which like and similar variables share a like symbol and a similar symbol respectively;

forming a table of output values computed from a table of a Boolean operator employing the constructed symbols of the input variable; and creating output symbols from the table of output values, wherein if all bits of a table index i of the table of output values (Ty_i) is constant, the symbol b_i for the index is set equal to the constant; if the table output index i of the table of output values (Ty_i) is equal to a Boolean variable (X_j), the symbol b_i is set equal to the input variable symbol constructed from the value of input variable; if the table output index i of the table of output values (Ty_i) is approximately equal to a Boolean variable (X_j), the symbol b_i is set approximately equal to the input variable symbol constructed from the value of input variable; otherwise the symbol b_i is set as undefined.

2. The method as described in claim 1, wherein

A is denoted as the set $\{0, 1, v\_1, v\_2, \ldots, v\_N, \sim v\_1, \sim v\_2, \ldots, \sim v\_n\}$;

the Boolean operator has inputs $x\_1, \ldots, x\_m$ and outputs $y\_1, \ldots, y\_k$ so that the Boolean operator may be denoted as $F(y\_1, \ldots, y\_k, x\_1, \ldots, x\_m)$;

$a\_1, \ldots, a\_m$ are values of input variables that are elements of the set A; and n is a number of different indexes i from $\{1, \ldots, N\}$ so that $v\_i$ or $\sim v\_i$ is included in the list $a\_1, \ldots, a\_m$;

symbols $U\_1, \ldots, U\_m$ and $W\_1, \ldots, W\_n$ are constructed utilizing the values of input variables.

3. The method as described in claim 2, wherein constructing symbols $U\_1, \ldots, U\_m$ and $W\_1, \ldots, W\_n$ is performed as follows:

(a) s=1 and i=1;

(b) if i is not less than m, end method;

(c) if i is less than m, set j=1;

(d) if j is less than i proceed to step (e), otherwise proceed to step (h);

(e) determine if $a_i == a_j$, if yes, set f=1 and $U_i = U_j$ and proceed to step (h), otherwise proceed to step (f);

(f) determine if $a_i == \sim a_j$, if yes, set f=-1 and $U_i = \sim U_j$ and proceed to step (h), otherwise proceed to step (g);

(g) increment j and proceed to step (d);

(h) determine if f==0, if no proceed to step (i), otherwise proceed to step (j)

(i) increment i and proceed to step (b);

(j) set $U_i = X_s$; $W_s = a_i$; increment s and proceed to step (b).

4. The method as described in claim 2, wherein the table of outputs is formed as follows: the Boolean operator including the constructed symbols, denoted as $F(y\_1, \ldots, y\_k, U\_1, \ldots, U\_m)$, is set equal to $G(y\_1, \ldots, y\_k, X\_1, \ldots, X\_m)$; utilizing a table of the operator F, G is computed for values of $X\_1, \ldots X\_n$, in which $Ty\_1, \ldots, Ty\_k$ are table of size $2^{\{n\}}$ of values of outputs $y\_1, \ldots, y\_k$, and $TX\_1, \ldots, TX\_n$ are tables of size $2^{\{n\}}$ of selector functions $X\_1, \ldots, X\_n$.

5. The method as described in claim 1, further comprising obtaining a netlist;

splitting the obtained netlist into at least two instance sets, including logical non sequential instance sets and all others;

making an ordered logic instances list;

constructing a simulation alphabet A from names of netlist nets, wherein a simulation value S(NT) is computed from A for each net NT and utilized to optimize the simulation alphabet; and proceeding through the ordered instances list, let i-th intake is $(F.y\_1(NO\_1), \ldots, Y\_k(NO\_k), .x\_1(NI\_1), \ldots, .x\_m(NI\_m))$; where $x-1, \ldots, x\_m$ are inputs and $y\_1, \ldots, y\_k$ are outputs, values $S(NO\_1), \ldots, S(NO\_k)$ are computed in accordance with the method of claim 3, wherein if S(NO)i is undefined, then S(NO_i) is set equal to NO_i.

6. The method as described in claim 5, wherein for each instance in the list, a driver of an input net may include at least one of an input port of netlist; output of non logical cell; and output of logical cell with smaller index in ordered list.

7. The method as described in claim 5, wherein a global simplification method is applied to a netlist.

8. The method as described in claim 7, wherein global simplification includes constructing a set of variables V from the ordered instances list which includes at least one of input port of the netlist and outputs of non logical cells.

9. The method as described in claim 8, wherein in a i-th logic instance $F(.y\_1(NO\_1), \ldots, .y\_k(NO\_k), .x\_1(NI\_1), \ldots, .x\_m(NI\_m))$, if a value S(NO_i) is at least one of not variable and variable from set V, the value S(NO_i) is undefined; otherwise variable S(NO_i) is added to set V.

10. The method as described in claim 9, wherein netlist nets marked as undefined are removed and instances in which directed connections to output of a logical subnetlist are not available, including at least one of output ports of netlist and inputs of non logical elements.

11. The method as described in claim 7, wherein a local simplification method is employed including at least one of output pins of a cell marked as undefined are eliminated; input pins of a cell marked by constant are simplified; and input pins of a cell at least one of marked by negations of a variable and pins having at least one of similar and inverse marks are combined.

12. A system for performing a simulation, comprising:
a memory suitable for storing a program of instructions; and
a processor communicatively coupled to the memory, wherein the program of instructions configures the processor to
receive a set A of values of a netlist, the set A including input variables which are elements of the set A;
construct symbols of the input variables in which like and similar variables share a like symbol and a similar symbol respectively;
form a table of output values computed from a table of a Boolean operator; and
create output symbols from the table of output values, wherein if all bits of a table index i of the table of output values (Ty_i) is constant, the symbol b_i for the index is set equal to the constant; if the table output index i of the table of output values (Ty_i) is equal to a Boolean variable (X_j), the symbol b_i is set equal to the input variable symbol constructed from the value of input variable; if the table output index i of the table of output values (Ty_i) is approximately equal to a Boolean variable (X_j), the symbol b_i is set approximately equal to the input variable symbol constructed from the value of input variable; otherwise the symbol b_i is set as undefined.

13. The system as described in claim 12, wherein A is denoted as the set $\{0, 1, v\_1, v\_2, \ldots, v\_N, \sim v\_1, \sim v\_2, \ldots, \sim v\_n\}$;
the Boolean operator has inputs x_1, ... ,x_m and outputs y_1, ... , y_k so that the Boolean operator may be denoted as F(y_1, ... ,y_k, x_1, ... , x_m);
a_1, ... ,a_m are values of input variables that are elements of the set A; and
n is a number of different indexes i from $\{1, \ldots, N\}$ so that v_i or ~v_i is included in the list a_1, ... ,a_m; symbols U_1, ... ,U_m and W_1, ... ,W_n are constructed utilizing the values of input variables.

14. The system as described in claim 13, wherein constructing symbols U_1, ... ,U_m and W_1, ... ,W_n is performed as follows:
(a) s=1 and i=1;
(b) if i is not less than m, end method;
(c) if i is less than m, set j=1;
(d) if j is less than i proceed to step (e), otherwise proceed to step (h);
(e) determine if $a_i == a_j$, if yes, set f=1 and $U_i = U_j$ and proceed to step (h), otherwise proceed to step (f);
(f) determine if $a_i == \sim a_j$, if yes, set f=−1 and $U_i = \sim U_j$ and proceed to step (h), otherwise proceed to step (g);
(g) increment j and proceed to step (d);
(h) determine if f==0, if no proceed to step (i), otherwise proceed to step (j)

(i) increment i and proceed to step (b);
(j) set $U_i = X_s$; $W_s = a_i$; increment s and proceed to step (b).

15. The system as described in claim 13, wherein the table of outputs is formed as follows: the Boolean operator including the constructed symbols, denoted as F(y_1, ... , y_k, U_1, ... ,U_m), is set equal to G(y_1, ... , y_k, X_1, ... ,X_m); utilizing a table of the operator F, G is computed for values of X_1, ... X_n, in which Ty_1, ... , Ty_k are table of size $2^{\{n\}}$ of values of outputs y_1, ... ,y_k, and TX_1, ... ,TX_n are tables of size $2^{\{n\}}$ of selector functions X_1, ... ,X_n.

16. The system as described in claim 12, further comprising
obtaining a netlist;
splitting the obtained netlist into at least two instance sets, including logical non sequential instance sets and all others;
making an ordered logic instances list;
constructing a simulation alphabet A from names of netlist nets, wherein a simulation value S(NT) is computed from A for each net NT and utilized to optimize the simulation alphabet; and
proceeding through the ordered instances list, let i-th intake is (F.y_1(NO−1), ... ,Y_k(NO_k),.x_1(NI_1), ... ,.x_m(NI_m)); where x−1, ... ,x_m are inputs and y_1, ... ,y_k are outputs, values S(NO_1), ... ,S(NO_k) are computed in accordance with the method of claim 3, wherein if S(NO)i is undefined, then S(NO_i) is set equal to NO_i.

17. The system as described in claim 16, wherein for each instance in the list, a driver of an input net may include at least one of an input port of netlist; output of non logical cell; and output of logical cell with smaller index in ordered list.

18. The system as described in claim 16, wherein a global simplification method is applied to a netlist.

19. The system as described in claim 18, wherein global simplification includes constructing a set of variables V from the ordered instances list which includes at least one of input port of the netlist and outputs of non logical cells.

20. The system as described in claim 19, wherein in a i-th logic instance F(.y_1(NO_1), ... ,.y_k(NO_k),.x_1(NI_1), ... ,.x_m(NI_m)), if a value S(NO_i) is at least one of not variable and variable from set V, the value S(NO_i) is undefined; otherwise variable S(NO_i) is added to set V.

21. The system as described in claim 20, wherein netlist nets marked as undefined are removed and instances in which directed connections to output of a logical subnetlist are not available, including at least one of output ports of netlist and inputs of non logical elements.

22. The system as described in claim 18, wherein a local simplification method is employed including at least one of output pins of a cell marked as undefined are eliminated; input pins of a cell marked by constant are simplified; and input pins of a cell at least one of marked by negations of a variable and pins having at least one of similar and inverse marks are combined.

23. A computer executable system for performing simulation comprising:
means for receiving a set A of values, the set A including input variables which are elements of the set A;
means for constructing symbols of the input variables received by the receiving means, in which like and similar variables share a like symbol and a similar symbol respectively;
means for forming a table of output values computed from a table of a Boolean operator, the Boolean operator having the symbols constructed by the constructing means; and means for creating output symbols from the table of output values obtained from the forming means, wherein if all bits of a table index i of the table of output values ($Ty\_i$) is constant, the symbol b i for the index is set equal to the constant; if the table output index i of the table of output values ($Ty\_i$) is equal to a Boolean variable ($X\_j$), the symbol $b\_i$ is set equal to the input variable symbol constructed from the value of input variable; if the table output index i of the table of output values ($Ty\_i$) is approximately equal to a Boolean variable ($X\_j$), the symbol $b\_i$ is set approximately equal to the input variable symbol constructed from the value of input variable; otherwise the symbol $b\_i$ is set as undefined.

* * * * *